FABRICATION OF SEMICONDUCTOR CONTROLLED RECTIFIERS

Filed Jan. 4, 1963

WITNESSES

Edwin E. Bassler

James F. Young

INVENTOR

Adalbert N. Knopp

BY Gordon H. Telfer

ATTORNEY

United States Patent Office 3,362,858
Patented Jan. 9, 1968

3,362,858

FABRICATION OF SEMICONDUCTOR CONTROLLED RECTIFIERS

Adalbert N. Knopp, Greensburg, Pa., assignor to Westinghouse Electric Corporation, Pittsburgh, Pa., a corporation of Pennsylvania Filed Jan. 4, 1963, Ser. No. 249,496
8 Claims. (Cl. 148—177)

This invention relates generally to semiconductor controlled rectifiers and, more particularly, to the fabrication of semiconductor controlled rectifiers having a relatively shallow impurity concentration gradient at the collector junction as well as a relatively high surface impurity concentration.

It has been previously disclosed by R. W. Dolan and T. C. New in copending application, Ser. No. 249,530, filed Jan. 4, 1963, now Patent No. 3,249,831, and assigned to the assignee of the present invention, that to make a controlled rectifier having a high breakover voltage and other desirable characteristics, two impurities of the same type may be diffused into the starting material, one impurity penetrating to the desired collector junction depth and providing a shallow impurity concentration gradient and the other impurity providing a high surface impurity concentration. According to this copending application, the two impurities are diffused simultaneously from the same source. While this method may be generally satisfactory, it is desirable to provide other methods for the fabrication of controlled rectifiers with these features. Reference should be made to the foregoing copending application for a fuller discussion of the problems and their general solution as disclosed therein. In the following discussion, the "junction" referred to, unless otherwise indicated, is the collector junction of the controlled rectifier.

It is therefore an object of the present invention to provide improved methods for the fabrication of semiconductor controlled rectifiers.

Another object of the present invention is to provide improved methods for making controlled rectifiers which utilize readily available single impurity diffusion sources.

One feature of the present invention, in brief, is a method of fabricating semiconductor controlled rectifiers wherein a first impurity is diffused into the starting material and penetrates to the desired junction depth and provides a shallow impurity concentration gradient at the junction. In a separate diffusion operation, a second impurity of the same type is diffused to provide a relatively high surface concentration. The diffusion of the junction-forming impurity is generally performed first but the order of the diffusion operations may be reversed. According to another feature of the present invention, the two diffusion operations are performed simultaneously from two separate sources.

The invention is particularly applicable to the fabrication of controlled rectifiers in n-type silicon wherein the impurity which provides the shallow impurity concentration at the junction is aluminum and the impurity which provides the desired high surface concentration is gallium. However, as will be shown, other selected impurities may be similarly employed with other semiconductor materials.

The features of the present invention, together with the above-mentioned and other objects and advantages thereof, may best be understood by reference to the following description, taken in connection with the accompanying drawings, in which.

Figure 1:
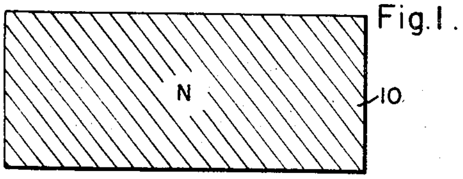
FIGURES 1 to 4 are cross-sectional views of a semiconductor controlled rectifier made in accordance with this invention as progressive stages in the fabrication process.

Referring to FIG. 1, there is shown, in cross section, a semiconductor wafer 10 which, for purposes of an example, has been selected of n-type semiconductivity.

Figure 2:
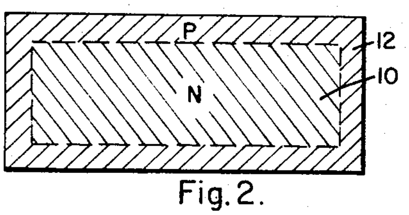

Referring to FIG. 2, the starting wafer 10 is shown after it has been diffused with a first impurity in accordance with the present invention to form a p-type diffused layer 12. The first impurity penetrates within the wafer to provide a shallow impurity concentration gradient at the p-n junction 11. The shallow concentration results from maintaining a low surface concentration (of the order of $10^{16}$ atoms per cubic centimeter) during the diffusion.

Figure 3:
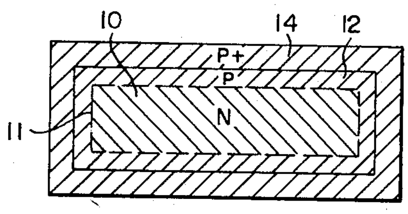

In FIG. 3, the wafer 10 is shown after it has been diffused with a second p-type impurity which provides an outer p-type diffused layer 14 having a higher surface concentration and is therefore designated p+ type to differentiate it from the first diffused p-type layer 12. The second impurity is diffused with a surface concentration of about $10^{17}$ or $10^{18}$ atoms per cubic centimeter.

Figure 4:
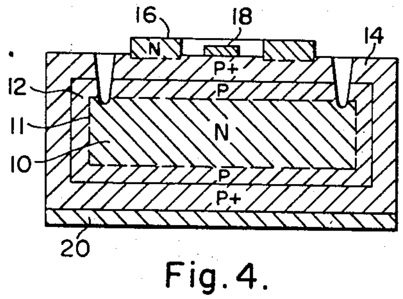

The subsequent fabrication of the device, which results in the structure shown in FIG. 4, may be performed by conventional methods including the fusion of alloy foil members to provide an n-type region 16 on the upper surface to serve as the cathode-emitter, an ohmic contact 18 to the base region (provided by a first part of the diffused layers 12 aund 14) to provide a gate terminal of the device and an ohmic contact 20 on the lower surface for the anode which is provided by a second part of the diffused layers 12 and 14. As is also conventional, the diffused layers are separated by a groove to provide two distinct portions on the upper and lower surface.

The method of the present invention may be performed using n-type silicon having a resistivity of from about 20 ohm-centimeters to about 30 ohm-centimeters as the starting material with aluminum diffused first to a depth of from about 1 mil to about 2 mils with a surface concentration of the order of $10^{16}$ atoms per cubic centimeter and gallium diffused thereafter to a depth less than that of the aluminum with a surface concentration of the order of $10^{17}$ atoms per cubic centimeter to $10^{18}$ atoms per cubic centimeter.

As an example of the practice of the present invention, the first diffusion step may be performed into a starting wafer of n-type silicon having a thickness of about 10.5 mils and a resistivity of about 25 ohm-centimeters. The first diffusion step is performed with aluminum as the doping impurity which penetrates to a depth of about 1.2 mils with a surface concentration of about $3\times10^{16}$ atoms per cubic centimeter. The second diffusion step is performed with gallium as the doping impurity and is diffused to a surface concentration of about $5\times10^{17}$ atoms per cubic centimeter to a depth of about 1.6 mils. During this diffusion operation of the originally diffused aluminum atoms diffuse further into the semiconductive wafer so that the junction depth is about 2.7 mils. The fused n-type layer which provides the cathode-emitter of the device forms a junction at about 0.65 mil within the wafer.

Figure 5:
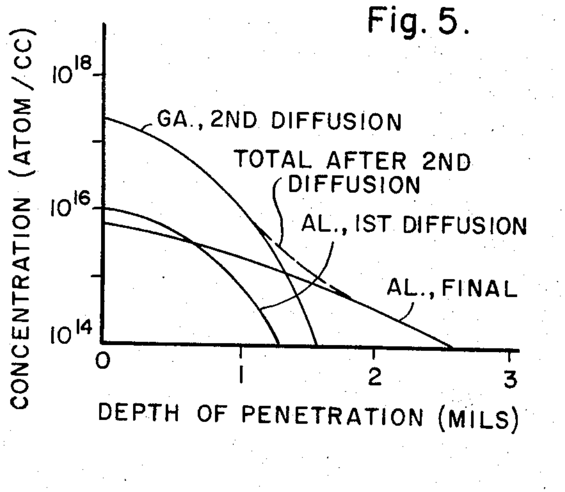
FIGS. 5 and 6 are charts showing the diffusion profile for two examples of the practice of the present invention.

FIG. 5 shows a diffusion profile resulting from the just described diffusion operations.

By diffusing gallium in the second diffusion for a longer time so that the previously deposited aluminum is rediffused to an even greater depth, an even higher breakover voltage may be achieved.

In the practice of this invention, silicon crystals are mechanically prepared and chemically cleaned by known techniques. The crystals are loaded into a quartz tube with the diffusion source. The tube is filled with an inert atmosphere and sealed. When aluminum is used as one of the impurities, the source may be metallic aluminum or silicon diffused with aluminum which is maintined at substantially the same temperature as the wafers to be diffused (between about 1100° C. and 1300° C.). The time for aluminum diffusion is preferably long to achieve a shallow gradient at the junction but may conveniently be from about 10 to 50 hours. When gallium is used as the other impurity, the source may be of gallium in either metallic or alloyed form which maintained at a different, generally lower, temperature than the wafers to be diffused to control the vapor pressure to achieve a surface concentration of the order of about $10^{17}$ or $10^{18}$ atoms per cubic centimeter. Specific parameters employed in the diffusion of the two impurities are readily determinable by those skilled in the art.

Figure 6:
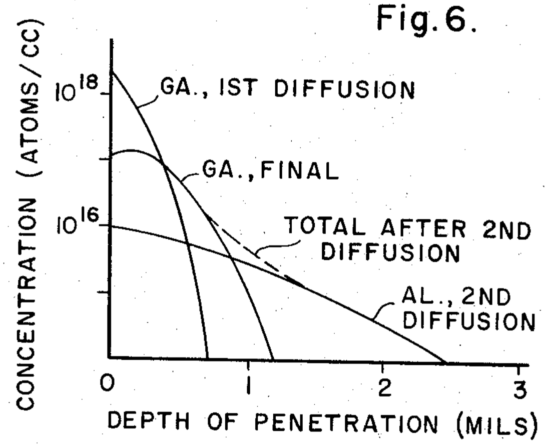

It is also possible within the scope of this invention to reverse the order in which the two impurities are diffused. For example, the first diffusion may be performed with gallium which will during the second diffusion with aluminum be reevaporated but still maintain a desirable high surface concentration. FIG. 6 shows a typical diffusion profile resulting from such diffusion operations.

It has been found in accordance with this invention that breakover voltages in excess of 1000 volts may be readily achieved.

In the practice of this invention, the surface concentration after the diffusion operations have been completed should, as previously mentioned, be relatively high (about $10^{17}$ to $10^{18}$ atoms per cubic centimeter. However, this value may if desired be varied within relatively wide limits since the fusion of the cathode-emitter alloy causes the emitter junction to be formed at a depth within the semi-conductive material and it is the impurity concentration at that depth which must be controlled for good characteristics. In general, it has been found that good cathode-emitter characteristics are achieved if the impurity concentration of the diffused base region at the junction is from about $6\times10^{16}$ atoms per cubic centimeter to about $3\times10^{17}$ atoms per cubic centimeter. Therefore, if the surface concentration is relatively high, $10^{18}$ atoms per cubic centimeter, for example, the emitter should be fused deeper than if the surface concentration is relatively low, such as $10^{17}$ atoms per cubic centimeter.

Figure 7:
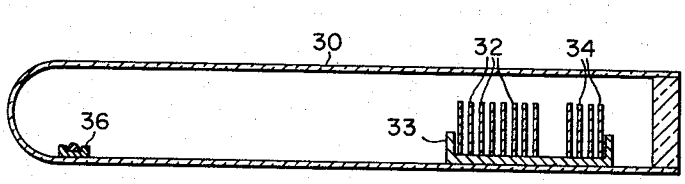
FIG. 7 is a cross-sectional view showing an arrangement for diffusion in accordance with an alternative form of the present invention.

Referring now to FIG. 7, there is shown the diffusion setup for another method of practicing the present invention. In this arrangement, within a sealed quartz tube 30 there are provided stacked n-type silicon wafers 32 to be diffused. Adjacent these wafers and conveniently within the same holder 33 are a plurality of p-type silicon wafers 34 which have been diffused with aluminum to a surface concentration of about $10^{16}$ atoms per cubic centimeter. Additionally, a metallic gallium source 36 is disposed at one end of the tube and the tube is back filled with argon to a pressure of .2 atmosphere at 25° C. The closed tube 30 is placed in a diffusion furnace so that the end at which the gallium source 36 is disposed is maintained at a temperature of about 600° C. while the other end at which the n-type silicon wafers and the p-type silicon wafers containing the aluminum are at a temperature of about 1215° C. with diffusion performed for time of about 46 hours, it is found that the aluminum penetrates to a depth of about 2.4 mils and provides a shallow impurity concentration gradient; gallium penetrates to about 1.6 mils and provides a surface concentration of about $8\times10^{17}$ atoms per cubic centimeter. The necessity for maintaining the gallium at a substantially lower temperature than the silicon is because otherwise too high a gallium surface concentration would result.

In the simultaneous diffusion method just described, successful diffusion of the fast diffusing impurity, aluminum, has been achieved when the number of wafers diffused with aluminum and acting as diffusion sources is about half the number of silicon wafers to be diffused.

The use of such diffused aluminum sources is preferred in this embodiment because use of metallic aluminum in the same tube with metallic gallium has been found to be difficult to control to get the desired diffusion profile.

In the method of simultaneously diffusing the two impurities from different sources, it is important that impurities be selected which have markedly different diffusion constants, at least different by a factor of 2. As is well known, the diffusion constant for aluminum is about three times greater than that for gallium. In the practice of the invention where two separate diffusion steps are used, the difference in diffusion rates is less cirtical because of greater flexibility possible in controlling the time and temperature of diffusion. It is even possible to employ the same impurity, gallium, for example, in both diffusion steps. The first step is a long, slow diffusion achieved by a relatively low gallium vapor pressure and the second step is a short, fast diffusion with a relatively high gallium vapor pressure. However, use of the same impurity in the two diffusion steps imposes additional control problems which is desirable to avoid and, hence, it is preferable here, also, to use two impurities with different diffusion constants.

It is to be understood that the practice of the present invention may be carried out with other semiconductive materials and impurities than those specifically disclosed. It is within the teachings of the present invention to use two impurities in any semiconductive material, one of which has a diffusion rate of at least 2 times the other, in the particular substrate used, so that the impurity with the higher diffusion rate penetrates gradient at the junction and the other impurity provides the relatively high surface concentration.

Following are examples of suitable impurities and semiconductive substrates which may be employed together (the faster diffusing impurity is given first).

| Substrate: | Impurities |
|---|---|
| n-Type Si | Al and either Ga or B. |
| n-Type Si | B and either In or Tl. |
| p-Type Si | P and either Bi, As or Sb. |
| p-Type Ge | In and Tl. |
| p-type Ge | As and either Bi, Sb or P. |
| p-Type Ge | Bi and P. |
| p-Type Ge | Sb and P. |
| n-Type InAs | Zn and Mg. |
| n-Type InAs | Cd and Zn. |

While the present invention has been shown and described in certain forms only, it will be obvious to those skilled in the art that it is not so limited but is susceptible to various changes and modifications without departing from the spirit and scope thereof.

I claim as my invention:

1. A method of fabricating a semiconductor device to provide a p-n junction with a shallow impurity concentration gradient, comprising the steps of: obtaining a semiconductor wafer of which at least a first surface is of a first type of semiconductivity; performing at least two impurity diffusion operations on said wafer, a first diffusion being of a first impurity penetrating within said semiconductor wafer to form a p-n junction and a second diffusion operation of a different impurity of the same type as said first impurity penetrating to a depth of less than the p-n junction formed by said first impurity and providing a higher surface concentration than that provided by said first impurity; and forming a region of said first type of semiconductivity in the region formed by said first and second diffusion operations.

2. A method of fabricating a semiconductor device in accordance with claim 1 wherein: said semiconductive wafer is of n-type silicon, said first diffusion is performed with aluminum as the impurity and said second diffusion is performed with gallium as the impurity.

3. A method of fabricating a semiconductor device in accordance with claim 1 wherein: said semiconductive wafer is of n-type silicon having a resistivity of from about 20 ohm-centimeters to about 30 ohm-centimeters; said first diffusion is performed with aluminum as the impurity diffused to a depth of from about 1 mil to about 2 mils with a surface concentration of the order of $10^{16}$ atoms per cubic centimeter; and said second diffusion is performed with gallium as the impurity diffused to a depth less than that of said aluminum with a surface concentration of the order of $10^{17}$ atoms per cubic centimeter to $10^{18}$ atoms per cubic centimeter.

4. A method for the fabrication of semiconductor controlled rectifiers comprising the steps of: obtaining a semiconductive substrate of a first type of semiconductivity; diffusing a first impurity capable of imparting a second type of semiconductivity to form a first diffused layer of said second type of semiconductivity on said substrate, said first diffused layer forming a p-n junction with said junction having a shallow impurity concentration gradient; diffusing a second impurity capable of imparting said second type of semiconductivity into said first diffused layer to form a second diffused layer having a higher surface concentration than that of said first diffused layer; said first and second impurities being diffused in separate diffusion operations; and said second impurity penetrating to less than the depth of penetration of said first impurity; forming a region of said first type of semiconductivity in said second diffused layer; forming ohmic contacts on said region of first type of semiconductivity, and on both major surfaces of said second diffused layer; and dividing said first and second diffused layers into two distinct portions, a first portion having said region of first type semiconductivity and a first of said ohmic contacts thereon and a second portion having a second of said ohmic contacts thereon.

5. A method for the fabrication of semiconductive controlled rectifiers in accordance with claim 4 wherein: said semiconductive substrate is of n-type silicon having a resistivity of from about 20 ohm-centimeters to about 30 ohm-centimeters; said first diffusion is performed with aluminum as the impurity diffused to a depth of from about 1 mil to about 2 mils with a surface concentration of the order of $10^{16}$ atoms per cubic centimeter; said second diffusion is performed with gallium as the impurity diffused to a depth less than that of said aluminum; and said step of forming a region of said first type of semiconductivity is done by fusing an alloy foil member to form a p-n junction at a depth within said second diffused layer at which the impurity concentration is from about $6 \times 10^{16}$ atoms per cubic centimeter to about $3 \times 10^{17}$ atoms per cubic centimeter.

6. In a method of fabricating a semiconductor device to provide a p-n junction with a high breakdown voltage the steps comprising: obtaining a semiconductor wafer of silicon of which at least a first surface is of n-type semiconductivity; performing two impurity vapor diffusion operations on at least said first surface of said wafer; one of said two diffusion operations being performed with aluminum as the impurity and the other of said two diffusion operations being performed with gallium as the impurity so that the aluminum, by reason of its faster diffusion rate, penetrates deeper than said gallium and forms a p-n junction with a shallow p-type impurity concentration gradient while the gallium provides a higher surface concentration on said first surface than would be possible with only the use of aluminum.

7. In a method as in claim 6 wherein: said aluminum is diffused prior to said gallium.

8. In a method as in claim 6 wherein: said gallium is diffused prior to said aluminum.

References Cited

UNITED STATES PATENTS

| | | | |
|---|---|---|---|
| 2,705,767 | 4/1955 | Hall | 148—186 |
| 2,819,990 | 1/1958 | Fuller et al. | 148—186 |
| 2,979,429 | 4/1961 | Cornelison et al. | 148—189 |
| 3,041,213 | 6/1962 | Anderson et al. | 148—189 |
| 3,064,167 | 11/1962 | Hoerni | 148—189 |
| 3,164,498 | 1/1965 | Loeb et al. | 148—189 |

HYLAND BIZOT, *Primary Examiner.*

DAVID L. RECK, R. O. DEAN, *Assistant Examiners.*